United States Patent
Banerjee et al.

(10) Patent No.: US 6,699,745 B1
(45) Date of Patent: Mar. 2, 2004

(54) CAPACITOR AND MEMORY STRUCTURE AND METHOD

(75) Inventors: Aditi Banerjee, Plano, TX (US); Rick L. Wise, Plano, TX (US); Darius L. Crenshaw, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/049,591

(22) Filed: Mar. 27, 1998

Related U.S. Application Data
(60) Provisional application No. 60/041,731, filed on Mar. 27, 1997.

(51) Int. Cl.[7] .......................................... H01L 21/8234
(52) U.S. Cl. ..................... 438/238; 438/239; 438/244; 438/253; 438/260; 438/255; 438/398; 438/665; 438/964; 257/308; 257/309; 257/303
(58) Field of Search ................................. 438/239, 166, 438/487, 255, 381, 387, 398, 665, 964, 260; 257/303, 308, 309

(56) References Cited

U.S. PATENT DOCUMENTS

| | | | | |
|---|---|---|---|---|
| 5,366,917 A | * | 11/1994 | Watanabe et al. | 437/47 |
| 5,372,962 A | * | 12/1994 | Hirota et al. | 437/47 |
| 5,385,863 A | * | 1/1995 | Tatsumi et al. | 437/109 |
| 5,405,801 A | * | 4/1995 | Han et al. | 437/60 |

* cited by examiner

*Primary Examiner*—Matthew Smith
*Assistant Examiner*—Belur Keshavan
(74) *Attorney, Agent, or Firm*—Carlton H. Hoel; W. James Brady; Frederick J. Telecky, Jr.

(57) ABSTRACT

A rugged polysilicon electrode for a capacitor has high surface area enhancement with a thin layer by high nucleation density plus gas phase doping which also enhances grain shape and oxygen-free dielectric formation.

2 Claims, 7 Drawing Sheets

CAPACITOR AND MEMORY STRUCTURE AND METHOD

This application claims priority under 35 USC §119(e)(1) of provisional application number 60/041,731 filed Mar. 27, 1997.

BACKGROUND OF THE INVENTION

The invention relates to electronic semiconductor devices, and, more particularly, to capacitor structures and fabrication methods for such structures.

Increasing demand for semiconductor memory and competitive pressures requires higher density integrated circuit dynamic random access memories (DRAMs) based on one-transistor plus one-capacitor memory cells. But down scaling capacitors with the standard silicon oxide and nitride dielectrics presents problems including decreasing quantity of charge stored in a cell. Consequently, DRAM manufacturers are investigating alternative dielectrics to increase capacitor dielectric constant and alternative cell structures to increase capacitor area. For example, U.S. Pat. No. 5,554,557 discloses a DRAM cell with a fence-shaped capacitor having a rugged polysilicon lower electrode to increase the capacitor area. The patent discloses deposition of rugged polysilicon by silane decomposition at 560° C. and a pressure about 200 mTorr to yield a layer of hemispherical grains of maximum thickness of 50–150 nm. Then conformally deposits a dielectric of silicon nitride, oxide/nitride/oxide, or tantalum pentoxide, and complete the capacitor with a top electrode of deposited polysilicon.

Ino et al., Rugged Surface Polycrystalline Silicon Film Deposition and its Application in a Stacked Dynamic Random Access Memory Capacitor Electrode, 14 J. Vac. Sci. Tech. B 751 (1996) describes (FIG. 14) capacitors with rugged polysilicon for layer thicknesses in the range of 40–150 nm with the optimal at a 100 nm thickness.

SUMMARY OF THE INVENTION

The present invention provides an HSG silicon (rugged polysilicon) layer of thickness less than 40 nm but with surface area increase of least 2 by high nucleation density deposition plus gas phase grain shape enhancement and doping in a single furnace operation. Preferred embodiment rugged polysilicon forms a (dynamic memory cell) capacitor electrode which is surface area enhanced and the capacitor dielectric is deposited without electrode exposure to oxygen sources.

This has the advantages of high packing density memory cells using processes compatible with standard silicon integrated circuit fabrication.

BRIEF DESCRIPTION OF THE DRAWINGS

The drawings are heuristic for clarity.

DESCRIPTION OF THE PREFERRED EMBODIMENTS

Overview

The preferred embodiments enhance capacitor electrode (plate) area while maintaining limited electrode thickness by using a high density of small grains of hemispherical grain (HSG) silicon (rugged poly). The preferred embodiment methods first form HSG silicon under conditions to grow small grains but with high areal density, next, gas phase enhance the grains plus dope the HSG silicon; and then immediately form initial capacitor dielectric without exposure to oxygen sources. The use of small grain HSG silicon limits the, effective thickness of the capacitor electrodes which allows smaller spacing between adjacent and multiple capacitor electrodes. The gas phase doping permits preliminary grain shape enhancement but makes the surface more susceptible to unwanted oxidation, thus the immediate initial dielectric formation yields a more uniform capacitor dielectric layer.

Figure 1A:
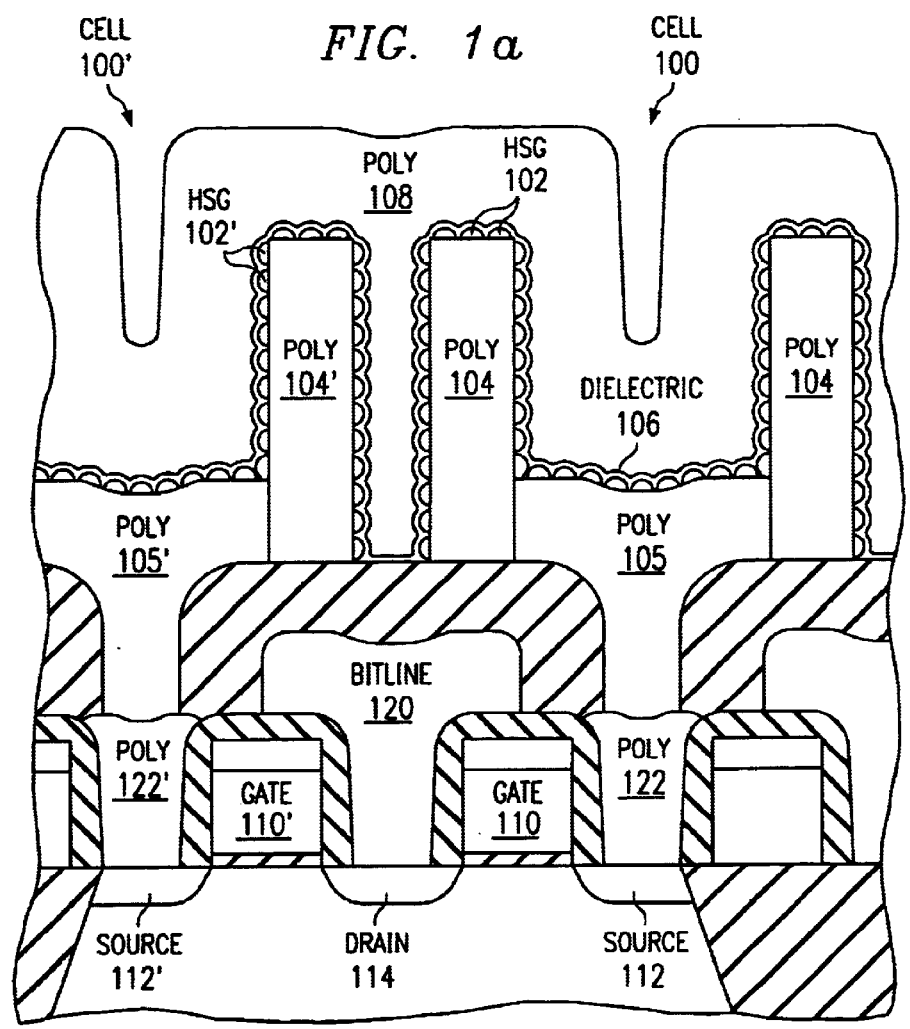
FIGS. 1a–b are cross sectional and elevating views of a preferred embodiment memory cell.
Figure 1B:
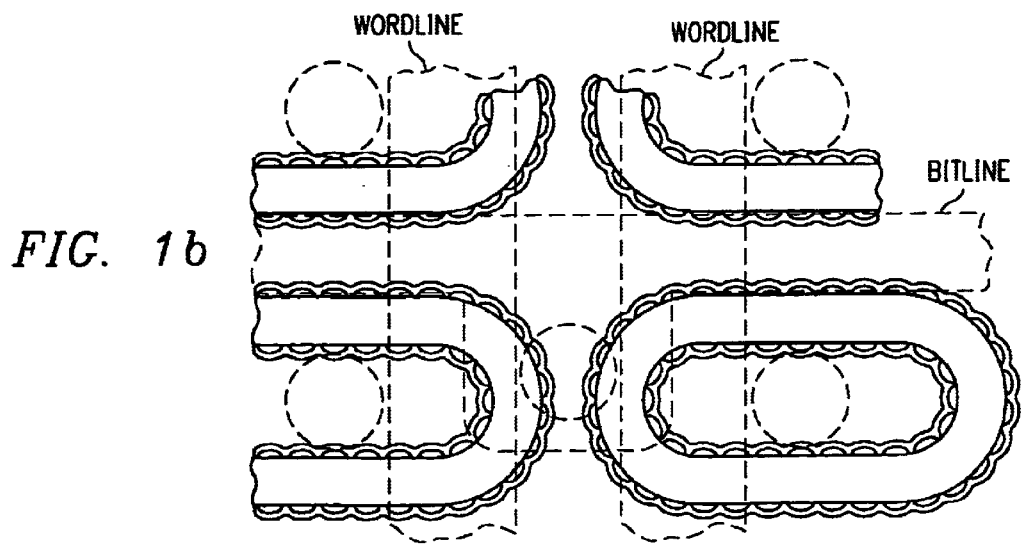

FIGS. 1a–b illustrate in cross-sectional and plan views a preferred embodiment DRAM cell 100 with HSG silicon 102 on polysilicon vertical cylinder 104 (which has the shape of an elongated crown) plus polysilicon base 105 forming the lower electrode of the cell capacitor. Dielectric 106 conforms to the surface of HSG silicon 102 and the portions of polysilicon 104–105 between the HSG silicon grains. Polysilicon 108 forms the top (common) capacitor electrode, although other materials such as TiN could be used. The pass transistor (gate 110 with source 112 and drain 114) connects bitline 120 to the lower capacitor electrode through polysilicon stem 122; bitline 120 runs parallel to the plane of FIG. 1a and only an offset making contact to drain 114 is shown in FIG. 1a. Note the separation between cell 100 and adjacent cell 100 (is determined by the minimal spacing between HSG 102 and HSG 102 (and this is the minimal thickness of top electrode 108. For example, crown polysilicon 104 may be 85 nm thick, HSG silicon 102 grains may be bulged and about 30–40 nm high, oxidized silicon nitride (NO) dielectric 106 may be 6 nm thick, and the minimal thickness of top electrode 108 between adjacent cells is about 100 nm. Thus if the HSG silicon grains were instead 70 nm high, the minimal thickness of top electrode 108 must decrease to 20 nm and it becomes unreliable.

Fabrication

FIGS. 2a–f illustrate the steps of fabrication of a DRAM in cross sectional elevation view at memory cell 100 portion of the substrate as follows.

(a) Start with a silicon substrate (or silicon on insulator substrate) with shallow trench isolation and twin wells for CMOS periphery plus memory array wells. Perform threshold adjustment implants (which may differ for cell transistors and various peripheral transistors), and form gate dielectric. Deposit tungsten silicide coated polysilicon gate material and a silicon dioxide layer, then pattern the layers to form oxide-topped gates 110 plus peripheral transistor gates and gate level interconnects. See FIG. 2a.

(b) Perform lightly doped drain implants, and then form sidewall dielectric on the gates by deposition plus anisotropic etching. Introduce dopants to form sources 112 and drains 114 including peripheral source/drains to complete the transistor level. Cover the structure with a planarized dielectric layer (such as BPSG); see FIG. 2b.

(c) Photolithographically define and etch holes (vias) in the planarized dielectric down to sources 112. Blanket deposit in situ doped polysilicon and etch back to form stems 122 in the holes. Next, photolithographically define and etch holes in the planarized dielectric down to drains 114. Blanket deposit in situ doped polysilicon and then a tungsten silicide cap, and pattern it to form bitlines 120 connecting to drains 114. Form planarized bitline dielectric which may contain an etchstop sublayer (e.g., sublayers of oxide and nitride). See FIG. 2c.

(d) Deposit an in situ doped polysilicon layer which will eventually be part of the horizontal base for the vertical polysilicon crown of cell 100; then photolithographically define holes in the polysilicon over the stems 122. Additionally, polysilicon sidewalls (blanket deposition plus anisotropic etch) may be applied to the holes in order to provide rounded corners and smaller diameters. Then use the polysilicon as an etch mask to etch the planarized bitline dielectric down to the stems 122; see FIG. 2d.

(e) Deposit an in situ doped polysilicon layer which connects to stems 122 and will eventually form the remainder of the horizontal base for the crown. Then a dielectric layer and photolithographically define the crown bases. Etch the dielectric and polysilicon to yield the crown bases covered with dielectric; see FIG. 2e.

Figure 2A:
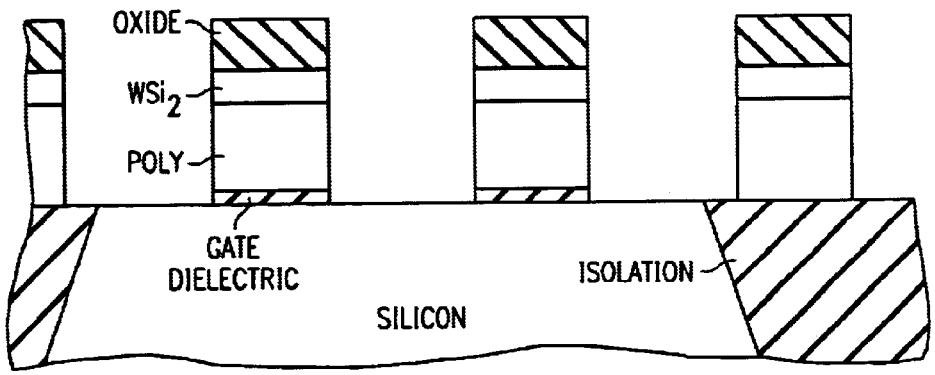
FIGS. 2a–f illustrate in cross sectional elevation views steps of a first preferred embodiment method.
Figure 2B:
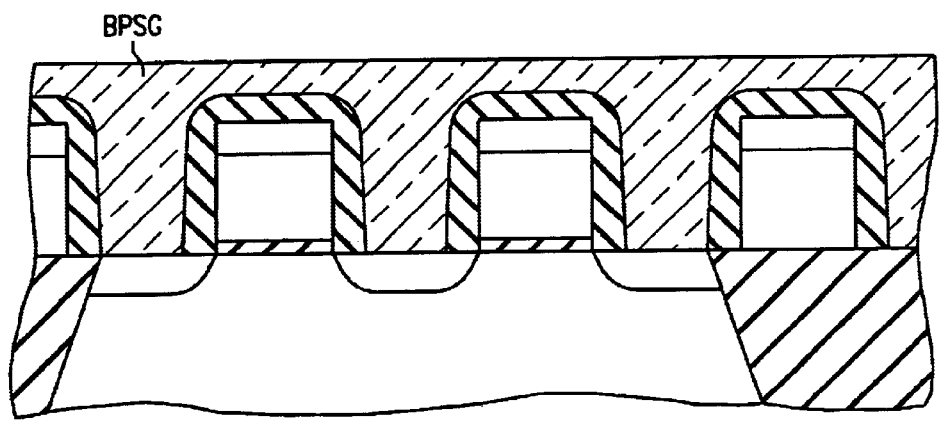
Figure 2C:
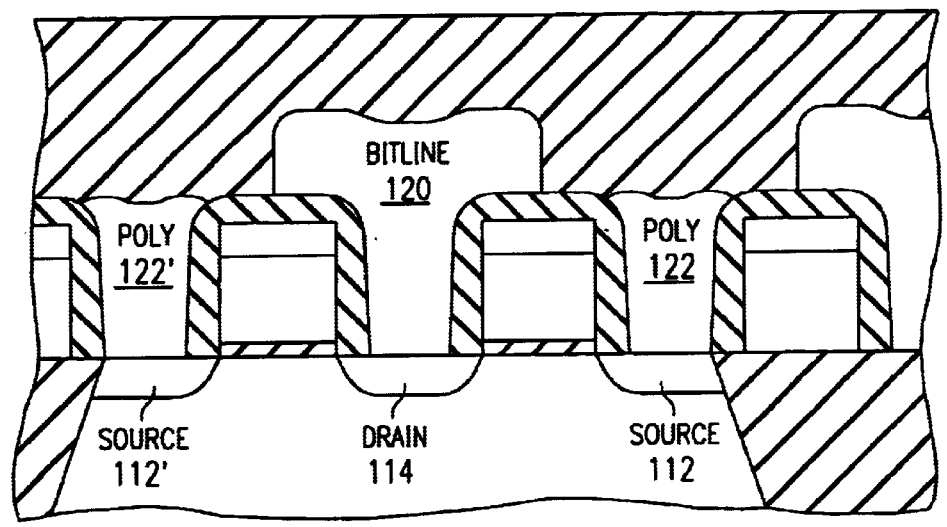
Figure 2D:
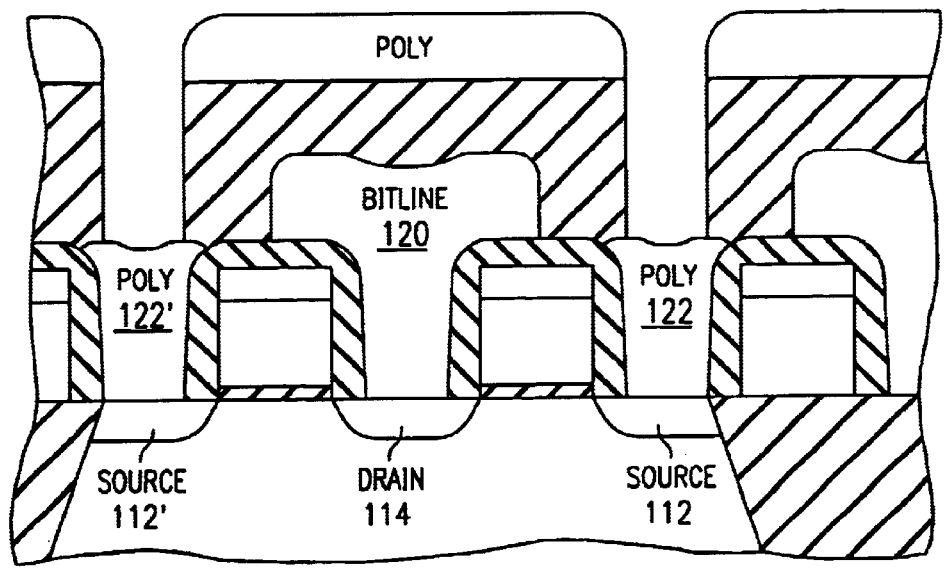
Figure 2E:
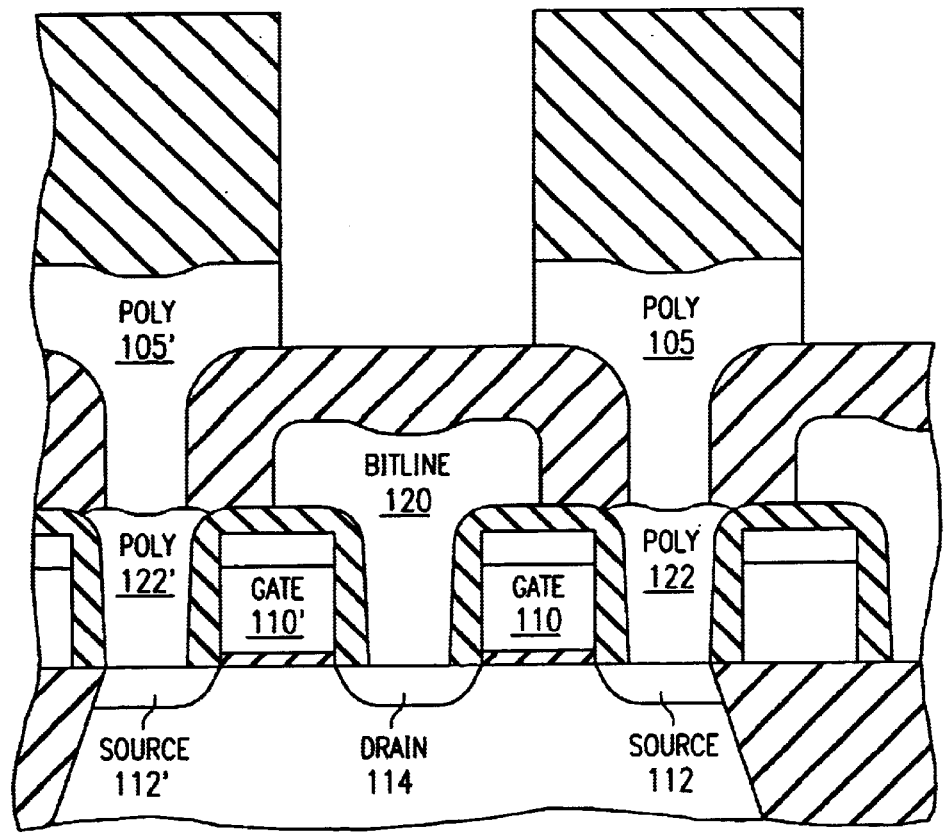
Figure 2F:
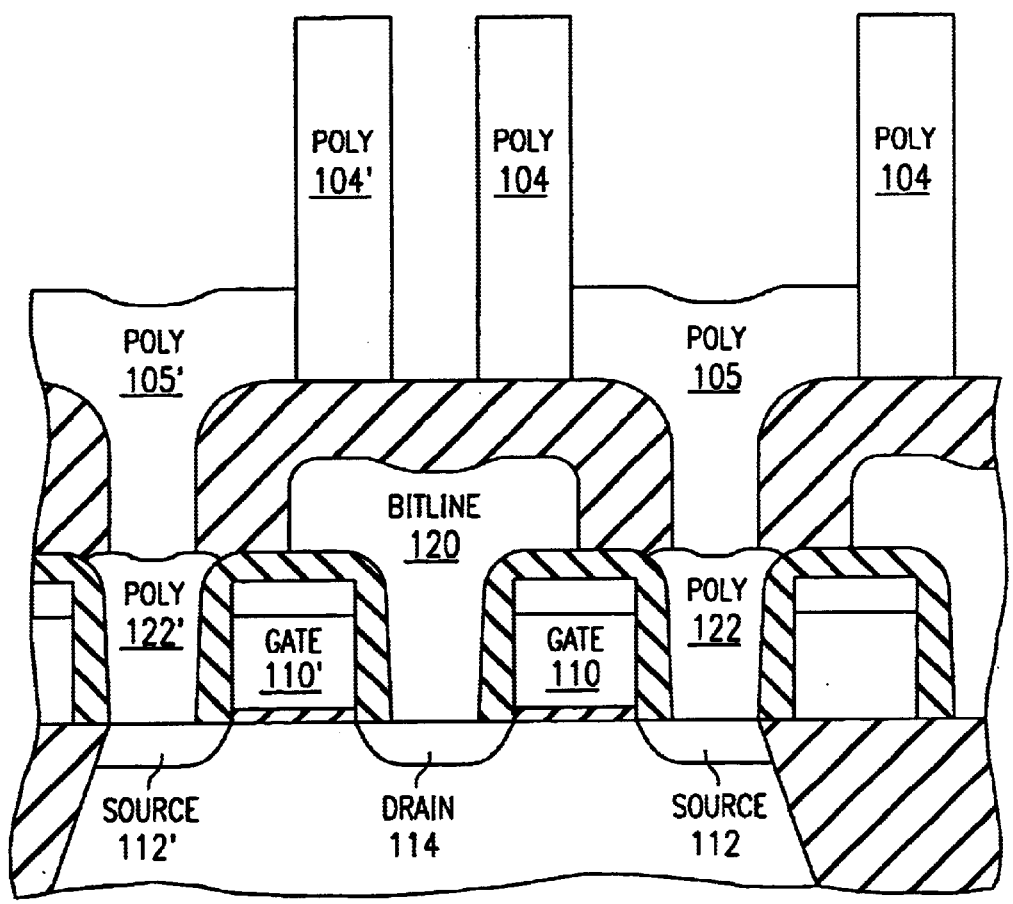

(f) Conformally deposit in situ doped (with phosphine) polysilicon, this makes contact to the exposed ends of polysilicon bases 105. Anisotrpically etch the polysilicon to remove the horizontal portions of the polysilicon (on top of the dielectric on the bases and on the bitline dielectric between bases). This forms the crowns as sidewalls on the dielectric and base ends; a chlorine based plasma etch may be used. Next, strip the dielectric to leave the free standing crowns with horizontal bases supported on stems; this strip can stop on the etchstop sublayer. FIG. 2f shows the situation with the etchstop at the surface of the bitline dielectric; with a buried etchstop layer the bottom of the crown bases can also be exposed and thereby increase the electrode area.

(g) Grow HSG silicon on the exposed surfaces of the polysilicon crowns and bases and, unavoidably, also on the exposed bitline dielectric. HSG silicon growth on (poly) silicon appears to occur in two stages: first nucleation and then a nuclei growth with coalescence into grains. Thus, nucleate HSG silicon on the polysilicon crown and base by silane decomposition at 571° C. with a silane flow of 450 sccm through a deposition chamber containing silicon wafers to form a layer of nuclei about 12 nm thick with a nucleation density of about $1.76 \times 10^{11}/cm^2$ in 1 minute; see FIG. 3a which is a TEM view showing the nuclei. Of course, the exact silane flow and temperature to produce this high nucleation density will depend upon chamber geometry, pressure, and total wafer area. In fact, FIG. 4 illustrates nucleation density for a variety of process chamber conditions and layer thicknesses. For example, a silane flow of about 230 sccm at 571° C. in 2 minutes yields a layer of nuclei about 17 nm thick and with a nucleation density of about $4.9 \times 10^{11}/cm^2$.

Figure 3A:
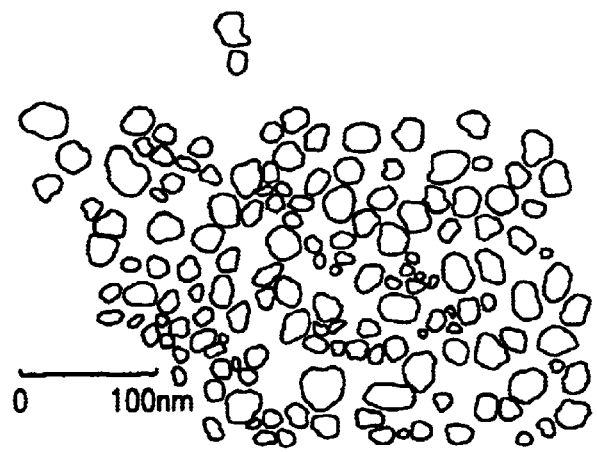
FIGS. 3a–c illustrate nucleation and grains.
Figure 3B:
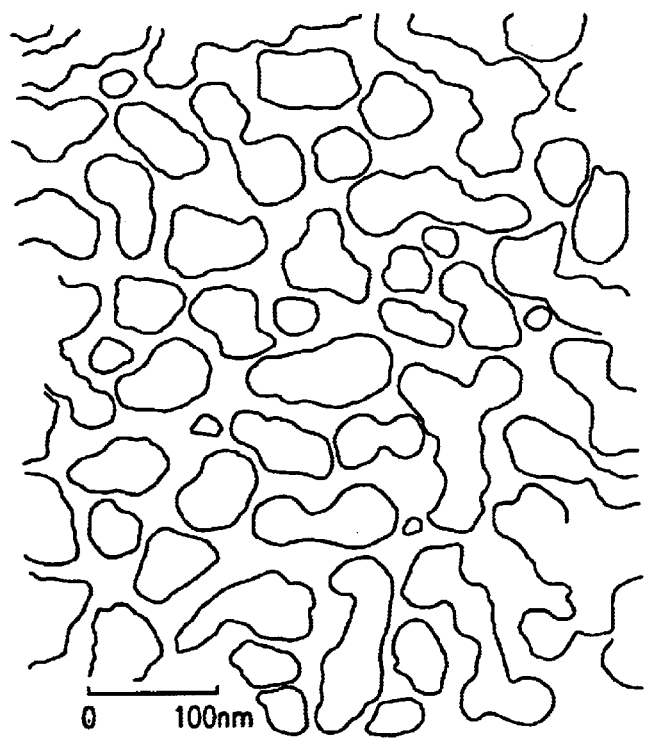
Figure 3C:
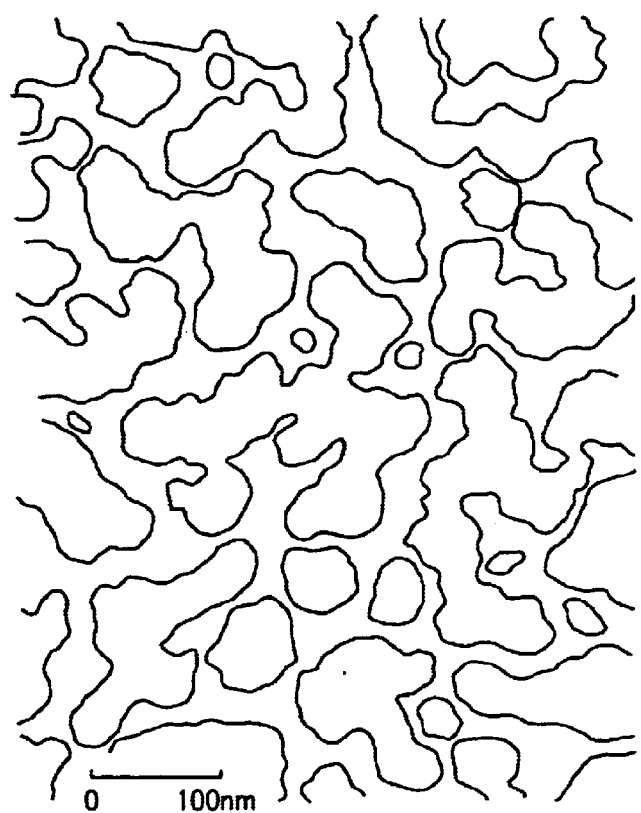
Figure 4:
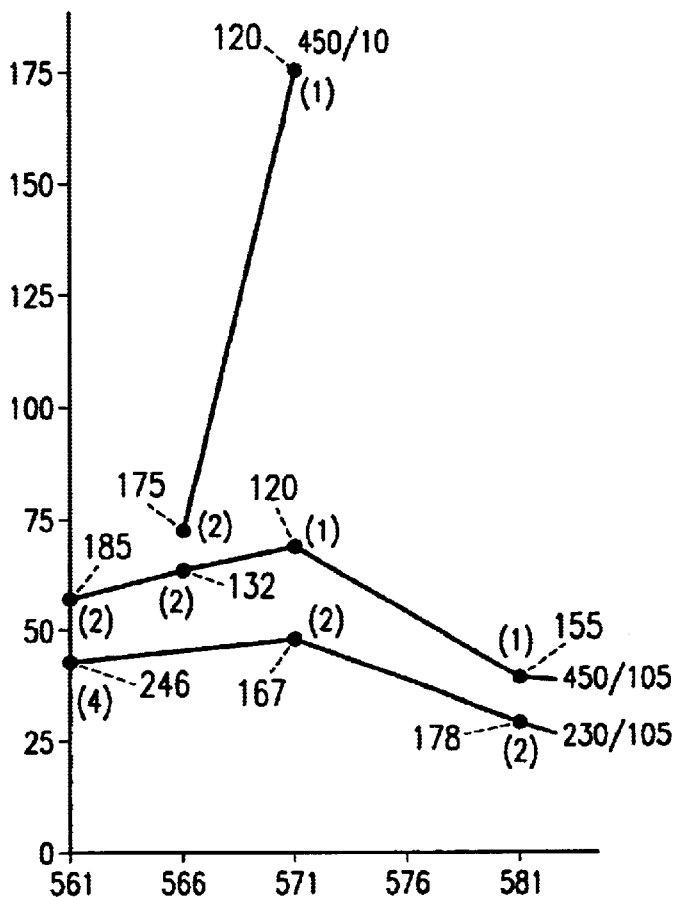
FIG. 4 shows nucleation densities.

Continue the HSG silicon growth at 571° C. with the 450 sccm silane flow another 2.5 minutes to yield a layer of grains about 30 nm maximum thickness FIG. 3b shows the grains, this has the same scale as FIG. 3a. Of course, if this layer of grains continued to grow to a thickness such as 75 nm, then this, density would yield a layer with the grains coalescing towards a solid layer of polysilicon, and this implies decreasing area enhancement. Note that the theoretical area increase by close packed hemispheres is independent of the hemisphere height; thus small close packed hemispheres provide the same area increase but form a thinner layer. In contrast, the foregoing lower nucleation density example has fewer larger grains at the same 30 nm thickness as illustrated in FIG. 3c, which has the same scale as FIGS. 3a–b.

(h) Photolithograhically mask the crowns and etch the HSG silicon on the bitline dielectric to insure separation of adjacent crowns. Alternatively, an unmasked anisotropic silicon etch could be used; this would decrease the crown height but maintain the surface ruggedness. The crowns and bases consist of in situ doped polysilicon plus the undoped HSG silicon on the surfaces. After photoresist removal clean the wafer to remove native oxide; the undoped HSG silicon does not oxidize as easily as the underlying phosphorus doped polysilicon.

Figure 5A:
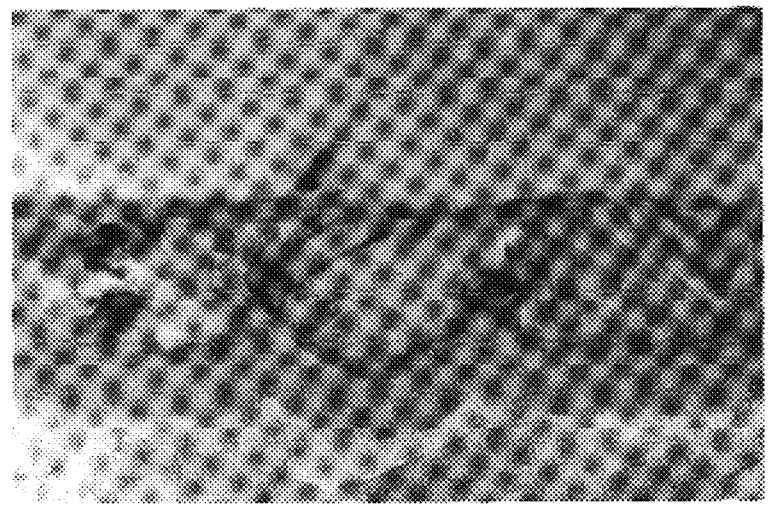
FIGS. 5a–b illustrate grain bulging.
Figure 5B:

(i) Enhance the HSG silicon grain shapes plus dope the grains with phosphorus by first bake the wafer at 850° C. in a hydrogen (H2) atmosphere for 30–60 minutes, this removes any residual native oxide plus migrates silicon atoms from the underlying polysilicon 104/106 onto the grains 102 and bulges the grains relative to the underlying polysilicon. The area enhancement (electrical measurement on resultant capacitors) increases from a factor of about 2.2 for the original grains to about 2.7 for the bulging grains. See FIGS. 5a–b showing the before and after of the shape enhancement, respectively. Then switch from the hydrogen atmosphere to a phosphine. ($PH_3$) atmosphere for 1 minute; the phosphine decomposes on the silicon surface and diffuses phosphorus into the grains resulting a surface doping concentration of phosphorus greater than $2 \times 10^{20}/cm^3$.

(j) Any free surface phosphorus, such as might occur in crevices between grains, and the highly doped grains from the preceding step provide very reactive sites for oxidation. Indeed, native oxide rapidly grows on heavily doped silicon, typically with thickness in the range of 1–3 nm; such an oxide (dielectric constant of 2.5–3.5) will degrades the effective dielectric constant of the capacitor which uses 6 nm of oxideized silicon nitride.(4.5 nm of nitride with dielectric constant 6.8 covered by 2 nm of thermal oxide with dielectric constant 3.9). Further, deposition of the silicon nitride dielectric by silane plus ammonia surface reaction has an incubation time for nucleation on oxide but minimal incubation for nucleation on silicon; thus the deposited nitride will be thinner on the surface oxidized silicon than on clean silicon. This thinner nitride (e.g., 2–2.5 nm instead of 4.5 nm) may be too thin to prevent oxidation of the underlying grains during the oxidation of the nitride. Consequently, immediately after the phosphine gas phase doping of the grains, evacuate the deposition chamber and decrease the temperature to 740° C., and flow in dichlorosilane and ammonia to deposit silicon nitride dielectric to a thickness of 4.5 nm. Alternatively, the wafer could be transferred from the phosphine doping chamber under vacuum to a silicon nitride deposition chamber. Then oxidize the nitride in steam at 850° C. to form about 2 nm of oxide plus plug pinholes in the nitride; this completes the dielectric.

(k) Deposit in situ doped polysilicon and pattern it to form the top capacitor electrode.

(l) Form interlevel dielectrics and interconnects; this also connects up peripheral circuitry in a DRAM.

HSG Growth

Figure 6:
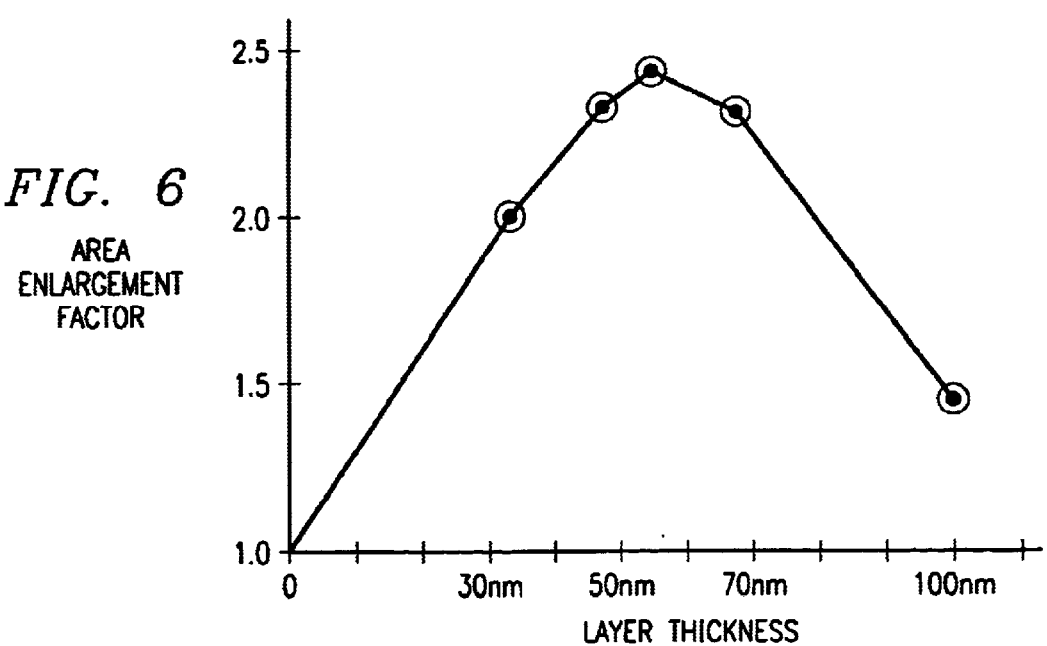
FIG. 6 shows area enhancement.

As the HSG grains grow and the layer thickens, the grains begin to coalesce. Grain growth increases the sloped grain sidewall area but grain coalescence eliminates sidewalls, so the total surface area has a maximum as illustrated in FIG. 6. Indeed, FIG. 6 shows the area enchancement factor (ratio of total rugged surface area to original planar area) after the grain shape enhancement during gas phase doping with the area enhancement factor measured by electrical measurement on a capacitor using the rugged polysilicon as the lower electrode. The HSG growth conditions for the capacitor of FIG. 6 were the same as the foregoing low nucleation density example illustrated in FIG. 3c. Indeed, FIG. 3c shows the lateral extension of the grains resulting from coalescence. The preferred embodiment high nucleation density should have a larger area enchancement factor for the smaller thickness layers (e.g., for the 30 nm thick) from the greater amount of grain sidewall area due to the lower coalescence; compare the laterally compact grains in FIG. 3b with the grains of FIG. 3c. Possibly, the faster nucleation and grain growth from the higher silane flow may lessen the coalescence and yield more compact grains and consequent greater area enhancement factors.

Modifications

The preferred embodiments can be modified in various ways while retaining the features of high area enhancement factors with thin (e.g., 30 nm thick) rugged polysilicon which has grain enhancement during gas phase doping and oxygen-free immediate dielectric formation.

For example, the process conditions can be varied, the silicon nitride dielectric deposition could be replaced with a rapid thermal nitridation (NH3 at 1000° C.) to form a thin nitride barrier followed by an oxide based dielectric (such as Ta2O5) deposition.

Further, the rugged polysilicon electrode capacitor could be the coupling capacitor in a EEPROM between the floating and control gates or a capacitor for general linear circuits or other coupling.

What is claimed is:

1. A method of fabricating a rugged polysilicon layer, comprising:

(a) forming a layer of hemispherical grain silicon nuclei of thickness about 12 nm;

(b) growing said nuclei into grains; and (c) enhancing the shapes of said grains.

2. The method of claim 1, wherein:

(a) said layer of nuclei has a nucleation density of about $1.76 \times 10^{11}/cm^3$.

* * * * *